(12) United States Patent
Macerola

(10) Patent No.: US 8,270,224 B2
(45) Date of Patent: Sep. 18, 2012

(54) VOLTAGE DISCHARGE CIRCUITS AND METHODS

(75) Inventor: Agostino Macerola, San Benedetto dei Marsi (IT)

(73) Assignee: Micron Technology, Inc., Boise, ID (US)

( * ) Notice: Subject to any disclaimer, the term of this patent is extended or adjusted under 35 U.S.C. 154(b) by 31 days.

(21) Appl. No.: 12/893,400

(22) Filed: Sep. 29, 2010

(65) Prior Publication Data

US 2012/0075935 A1   Mar. 29, 2012

(51) Int. Cl.
*G11C 16/06* (2006.01)
(52) U.S. Cl. .......... 365/185.25; 365/185.18; 365/185.17
(58) Field of Classification Search ............. 365/185.25, 365/185.18, 185.17
See application file for complete search history.

(56) References Cited

U.S. PATENT DOCUMENTS

| 5,115,146 A | 5/1992 | McClure |
| 5,942,925 A | 8/1999 | Stahl |
| 6,028,788 A * | 2/2000 | Choi et al. ............... 365/185.11 |
| 6,333,670 B1 * | 12/2001 | Kono et al. ................... 327/541 |
| 6,903,583 B1 | 6/2005 | Habib et al. |

* cited by examiner

*Primary Examiner* — Huan Hoang
(74) *Attorney, Agent, or Firm* — Leffert Jay & Polglaze, P.A.

(57) ABSTRACT

Memory devices, memory systems, discharge circuits, and methods for discharging a capacitance are disclosed. In one such memory device, a discharge circuit is coupled to memory support circuitry. When a supply voltage decreases to be less than or equal to a trip voltage, the discharge circuit discharges a voltage from a capacitance of the memory support circuitry.

22 Claims, 6 Drawing Sheets

VOLTAGE DISCHARGE CIRCUITS AND METHODS

TECHNICAL FIELD

The present embodiments relate generally to memory and a particular embodiment relates to voltage discharge during power loss in a memory.

BACKGROUND

Flash memory devices have developed into a popular source of non-volatile memory for a wide range of electronic applications. Flash memory devices typically use a one-transistor memory cell that allows for high memory densities, high reliability, and low power consumption. Common uses for flash memory include personal computers, flash drives, digital cameras, and cellular telephones. Program code and system data such as a basic input/output system (BIOS) are typically stored in flash memory devices for use in personal computer systems.

A typical flash memory device is a type of memory in which the array of memory cells is typically organized into memory blocks that can be erased and reprogrammed on block-by-block basis instead of one byte at a time. Changes in a threshold voltage of each of the memory cells, through erasing or programming of a charge storage structure (e.g., floating gate or charge trap) or other physical phenomena (e.g., phase change or polarization), determine the data value of each cell. The data in a cell of this type is determined by the presence or absence of the charge in the charge storage structure.

The erase, programming, and read operations typically use some appropriate relatively high voltage that is applied to particular nodes of the memory cells. Due to physical constraints of the memory cell array architecture, a relatively large capacitance is typically charged to the high voltage in order to apply the voltage to the appropriate terminal for a particular period of time.

After a memory operation has been completed, there is typically time allotted for the operation to include discharging capacitance on the various high voltage nodes back to a lower voltage (e.g., 0V). However, when a sudden power down occurs while the memory device is performing an operation, the internal controller may not have the time to perform a suitable reset routine. The high voltage nodes can remain charged to the relatively high voltage for time periods longer than is desirable for the various memory operations. This can result in data corruption in both user data and configuration data since it might not be possible to exclude some accidental wrong path selection in the memory array while the device is powering down.

For the reasons stated above, and for other reasons stated below that will become apparent to those skilled in the art upon reading and understanding the present specification, there is a need in the art for a way to discharge relatively high voltage nodes during a memory power down.

DETAILED DESCRIPTION

Figure 1:
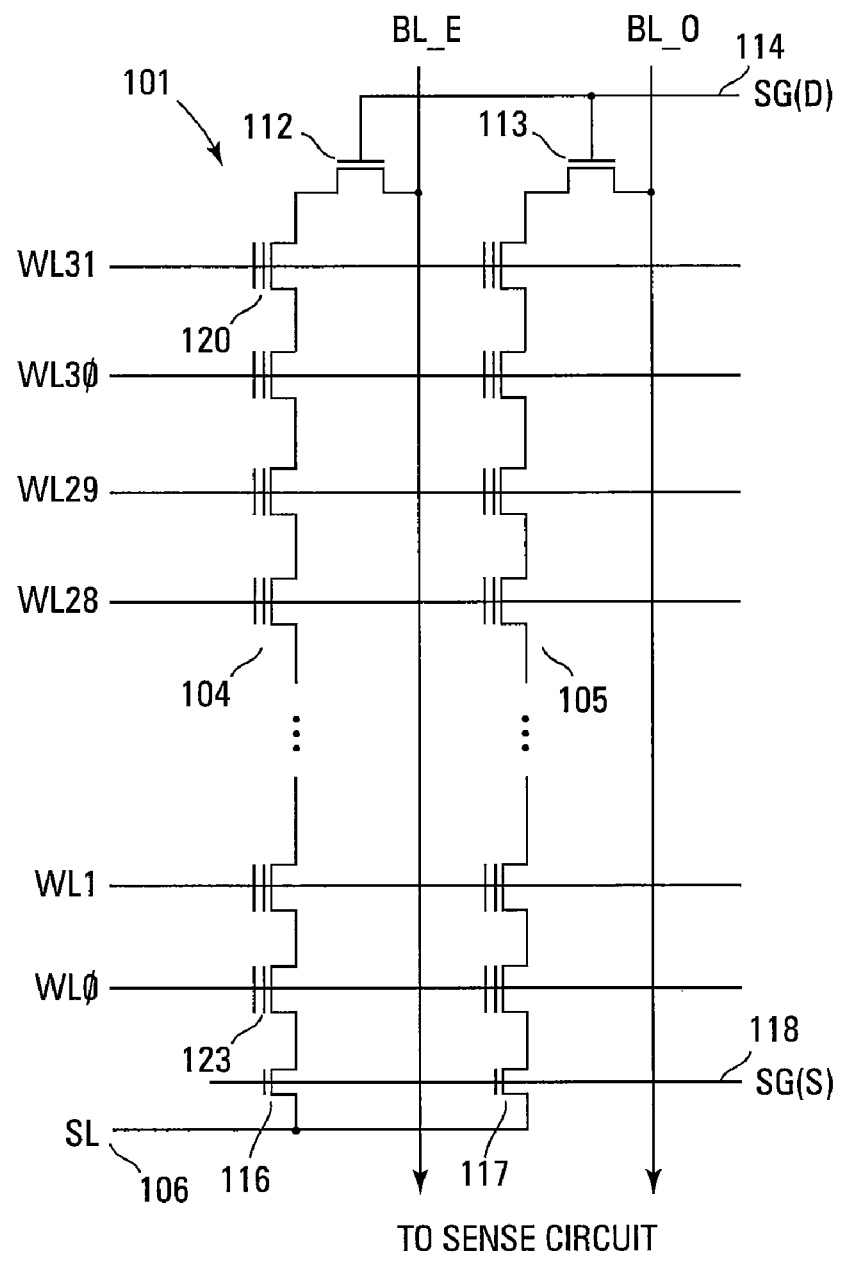
FIG. 1 shows a schematic of a portion of a typical NAND memory array.

In the following detailed description, reference is made to the accompanying drawings that form a part hereof and in which is shown, by way of illustration, specific embodiments. In the drawings, like numerals describe substantially similar components throughout the several views. Other embodiments may be utilized and structural, logical, and electrical changes may be made without departing from the scope of the present disclosure. The following detailed description is, therefore, not to be taken in a limiting sense.

FIG. 1 illustrates a schematic diagram of one embodiment of a portion of a NAND architecture memory array 101, as illustrated in subsequent sense circuit embodiments, comprising series strings of non-volatile memory cells. The present embodiments are not limited to the illustrated NAND architecture. Alternate embodiments can use NOR or other architectures as well.

The memory array 101 comprises an array of non-volatile memory cells (e.g., floating gate) arranged in columns such as series strings 104, 105. Each of the cells 101 is coupled drain to source in each series string 104, 105. An access line (e.g. word line) WL0-WL31 that spans across multiple series strings 104, 105 is coupled to the control gates of each memory cell in a row in order to bias the control gates of the memory cells in the row. Data lines, such as even/odd bit lines BL_E, BL_O, are coupled to the series strings and eventually coupled to sense circuitry that detect the state of each cell by sensing current or voltage on a selected bit line.

Each series string 104, 105 of memory cells is coupled to a source line 106 by a source select gate 116, 117 (e.g., transistor) and to an individual bit line BL_E, BL_O by a drain select gate 112, 113 (e.g., transistor). The source select gates 116, 117 are controlled by a source select gate control line SG(S) 118 coupled to their control gates. The drain select gates 112, 113 are controlled by a drain select gate control line SG(D) 114.

Each memory cell can be programmed as a single level cell (SLC) or a multiple level cell (MLC). Each cell's threshold voltage ($V_t$) is indicative of the data that is stored in the cell. For example, in an SLC, a $V_t$ of 1.5V might indicate a programmed cell while a $V_t$ of −0.5V might indicate an erased cell. The MLC uses multiple $V_t$ ranges that each indicates a different state. Multilevel cells can take advantage of the analog nature of a traditional flash cell by assigning a bit pattern to a specific $V_t$ range This technology permits the storage of data values representing two or more bits per cell, depending on the quantity of $V_t$ ranges assigned to the cell.

A typical programming operation that increases the selected memory cell's threshold voltage from an erased threshold voltage to a programmed threshold voltage might include applying a series of incrementally increasing programming pulses to a control gate of the selected memory cell. The programming pulses can start at an initial programming voltage (e.g., 15V). Subsequent programming pulses, if needed, are increased by a step voltage (e.g., 1V) from a previous programming voltage. These programming voltages are relatively high considering the memory device supply voltage ($V_{CC}$) can be less than 3V.

While the control gate of the selected memory cell is biased, through a word line, with the relatively high voltage during the programming operation, at least one portion of the memory array bulk (e.g., a p-well in the bulk) is biased with a relatively high voltage during an erase operation. As is known in the art, the memory array bulk is the semiconductor (e.g., silicon, germanium or the like) in which the memory array is formed. An erase operation to erase programmed memory cells might include applying an erase voltage (e.g., 0V) to a word line coupled to the selected memory cell while at least a portion of the memory array bulk might be biased at a relatively high voltage (e.g., 20V).

As illustrated subsequently with reference to FIG. 2, not only do the word lines have an associated capacitance to which the relatively high voltage is applied, but parasitic capacitance, especially with the relatively large silicon mass of the memory array bulk, can cause the relatively high voltage to remain for a time after the supply voltage has been removed. These relatively high voltages should be discharged after a power down, such as in order to reduce the chances of erroneous circuit operation after the control circuit has ceased operation.

Figure 2:
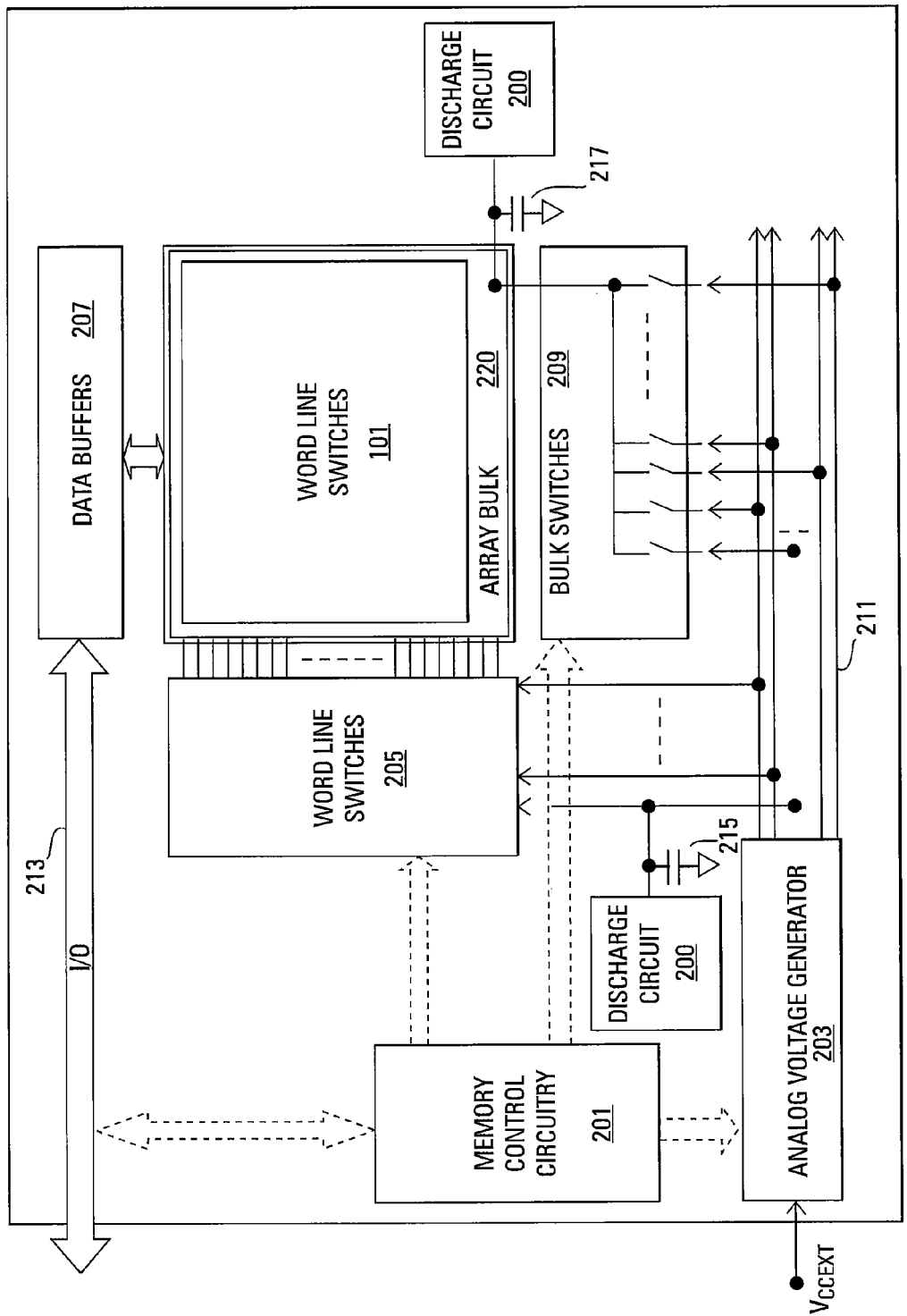
FIG. 2 shows a block diagram of one embodiment of a memory device that can utilize a discharge circuit.

FIG. 2 illustrates a block diagram of a memory device that includes discharge circuits 200. One example of such a discharge circuit is illustrated subsequently in FIG. 3.

FIG. 2 shows the memory array 101 formed in the memory array bulk 220. Voltage generators 203 provide the voltages to be applied to the memory cells during memory operations (e.g., program, erase, read). Word line switches 205 are coupled to the voltage generators 203 to provide switching of voltages to the control gates of the memory cells during memory operations. Bulk switches 209 are coupled to the voltage generators 203 to provide switching of voltages to the memory array bulk (e.g., portions of the bulk) during memory operations. The word line switches 205 and bulk switches 209, as well as other memory circuits, such as memory control circuitry 201, voltage generators 203, rails 211, and data buffers 207, can individually or in combination be referred to as memory support circuitry that support memory operation.

The word line switches 205, in response to control signals from the memory control circuitry 201, switch various voltages to the word lines of the memory array. The voltage that is switched depends on the memory operation that is presently being executed by the memory control circuitry 201. For example, the memory control circuitry 201 can instruct one of the voltage generators 203 to generate a relatively high voltage (e.g., 16V) for a programming operation. The memory control circuitry 201 can then instruct a particular word line switch to close in order to connect the relatively high voltage to the control gates of the memory cells coupled to the particular word line that are being programmed.

The bulk switches 209, in response to control signals from the memory control circuitry 201, switch various voltage to the memory array bulk 220 (e.g., to portions of the bulk). For example, an erase operation can use a relatively high voltage (e.g., 20V) applied to at least a portion of the memory array bulk 220 while the word lines are biased at a relatively low voltage (e.g., 0V). Thus, the memory control circuitry 201 instructs one or more of the bulk switches 209 to close in order to bias portion(s) of the bulk 220 with the appropriate voltage. Each of the different voltage rails 211 shown coupled to the voltage generators 203 can carry a different voltage. The memory control circuitry 201, by controlling both the voltage generators 203 and which switch or switches of the bulk switches 209 are closed, can control the particular voltage applied to the bulk 220.

FIG. 2 also illustrates the data buffers 207 that provide buffering of the data input/output signals 213. The data I/O signals 213 can include both address data and user data to be programmed into the memory array 101.

A first capacitance 215 is shown coupled to one of the rails 211. A second capacitance 217 is shown coupled to the array bulk 220. These capacitances 215, 217 represent both the parasitic capacitance of the switches and bulk, respectively, and can also represent an intentional capacitance (e.g., capacitors) coupled to the word line switches 205 to store a voltage for application to an appropriate word line. These capacitances 215, 217 are examples of capacitance that can be discharged by the discharge circuits 200 of the present embodiments.

Figure 3:
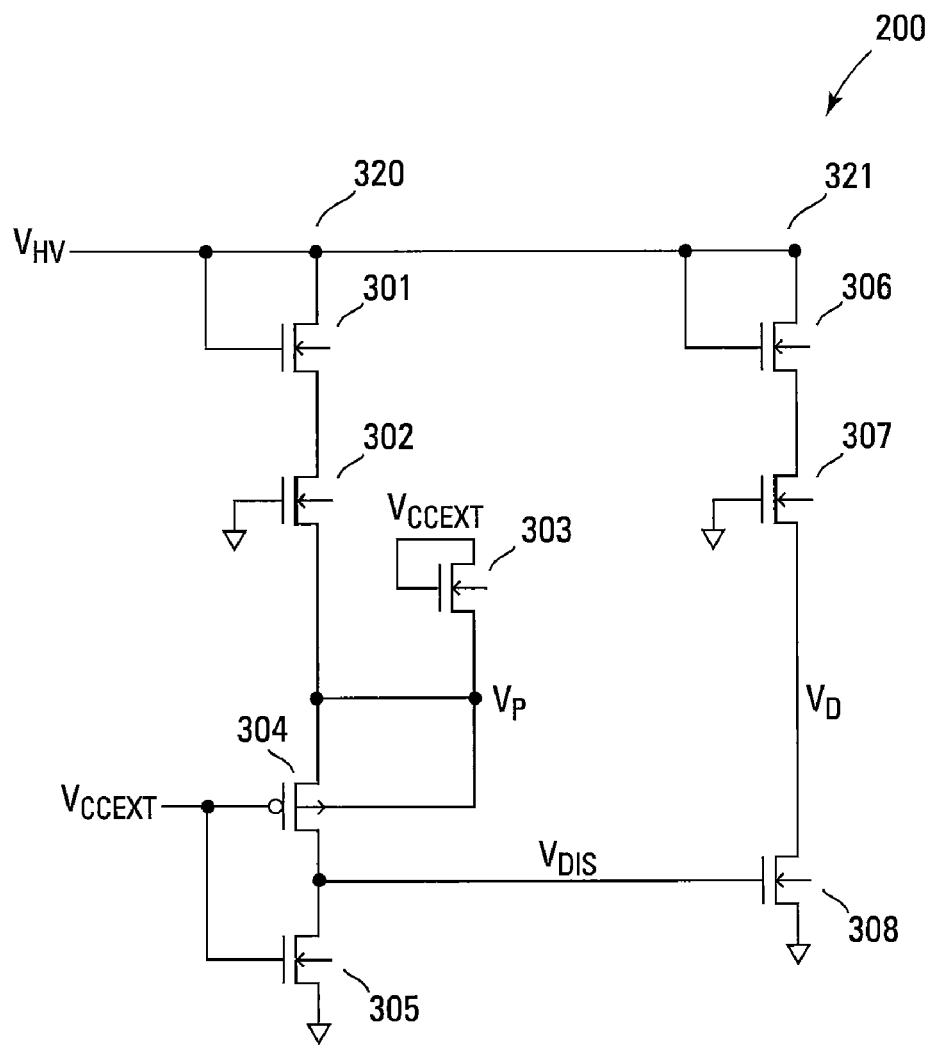
FIG. 3 shows a schematic diagram of one embodiment of a discharge circuit.

The discharge circuits 200 are shown coupled to the capacitances 215, 217 of FIG. 2. One embodiment of the a discharge circuits is illustrated in FIG. 3 and described subsequently. The locations for the discharge circuits 200 as shown in FIG. 2 are for purposes of illustration only as other nodes needing to be discharged can be coupled to a discharge circuit 200 as well. Additionally, more than one discharge circuit 200 might be used in certain embodiments. For example, the array bulk 220 can have a very large capacitance due to its size. Thus, multiple discharge circuits 200 can be coupled to the array bulk 220 in different locations in order to completely discharge the capacitance. Additionally, each different rail (e.g., a voltage line) from the voltage generators 203 to the word line switches 205 can have a separate discharge circuit 200. The discharge circuits 200 can be coupled to other memory support circuitry as well.

FIG. 3 illustrates a schematic diagram of one embodiment of a discharge circuit 200. This circuit is for purposes of illustration only as other circuits can be used to discharge the relatively high voltage nodes in a memory circuit.

The circuit of FIG. 3 is based on four different types of MOS transistors. These types include high voltage (e.g., thick oxide) NMOS transistors 301, 306 that support and manage relatively high voltages with a threshold voltage of approximately 1V. Thick oxide depletion mode NMOS transistors 302, 307 are used that have a threshold voltage of approximately −3.0V. Additionally, standard PMOS 304 and NMOS 303, 305, 308 transistors are also used.

The control gates and drains of both the thick oxide NMOS transistors 301, 306 are coupled to a relatively high voltage node $V_{HV}$. This is the node that is shown in FIG. 2 as being coupled to the capacitance to be discharged. In one embodiment, $V_{HV}$ is some low voltage (e.g., 0V) that is less than and external supply voltage $V_{CCEXT}$ when the memory device is not experiencing read/write/erase operations.

In one embodiment, the external supply voltage is in a range of 2.7V to 3.6V. Alternate embodiments can use other voltages or other voltage ranges. $V_{CCEXT}$ is coupled to the gate of the PMOS transistor 304 and the gate of one of the NMOS transistors 305. The source connection of the NMOS transistor 305 is coupled to ground.

The drain connections of the two depletion mode NMOS transistors 302, 307 are respectively coupled to source connections of the two high voltage input transistors 301, 306. The gates of the two depletion mode NMOS transistors 302, 307 are coupled to ground.

One of the NMOS transistors 303 is coupled so that its drain connection is coupled to its gate and its source connection is coupled to both the source connection of one of the depletion mode NMOS transistors 302 as well as the source and body connections of the PMOS transistor 304 at node $V_P$.

The drain connection of one of the NMOS transistors 308 is coupled to the source connection of one of the depletion mode transistors 307. The source connection of the NMOS transistor 308 is coupled to ground. The gate of the NMOS transistor 308 is coupled to the drain connection of the PMOS transistor 304 and the drain connection of the NMOS transistor 305.

In operation, while the memory device is not performing a read/write/erase operation (e.g., $V_{HV} < V_{CCEXT}$), the $V_P$ node is maintained at $V_{CCEXT} - V_{th}$ of the NMOS transistor 303. The PMOS transistor 304 is off and the NMOS transistor 305 is on. The $V_{DIS}$ node is pulled to ground. The steady state current in both the left 320 and right 321 branches of the circuit 200 is zero.

When $V_{HV}$ is a relatively high voltage (e.g., 15-30V), both the $V_P$ and $V_D$ nodes to approximately 3.0V. This is the nominal threshold voltage of the depleted transistors 302, 307. The current in the left 320 and right 321 branches of the circuit 200 is still zero.

If $V_{CCEXT}$ decreases quickly while $V_{HV}$ is still high, $V_P$ remains at 3.0V. The PMOS transistor 304 turns on when $V_{CCEXT} < V_P - V_{th}$ of the PMOS transistor 304. In one embodiment, the PMOS transistor 304 turns on at approximately 2.0V. The NMOS transistor 305 is still on.

The trip voltage at which the discharge circuit 200 discharges the capacitance can be set by the dimensioning of the NMOS 305 and PMOS 304 transistors during fabrication. For example, if the trip voltage is set to approximately 1.5V, when $V_{CCEXT}$ is less than or equal to 1.5V, node $V_{DIS}$ goes high to the $V_P$ voltage and the relatively high voltage at $V_{HV}$ is discharged through the NMOS transistor 308. $V_{HV}$ can be discharged down to a relatively low voltage (e.g., 2V). The discharged voltage is less than any voltage that can alter a memory cell.

Figure 4:
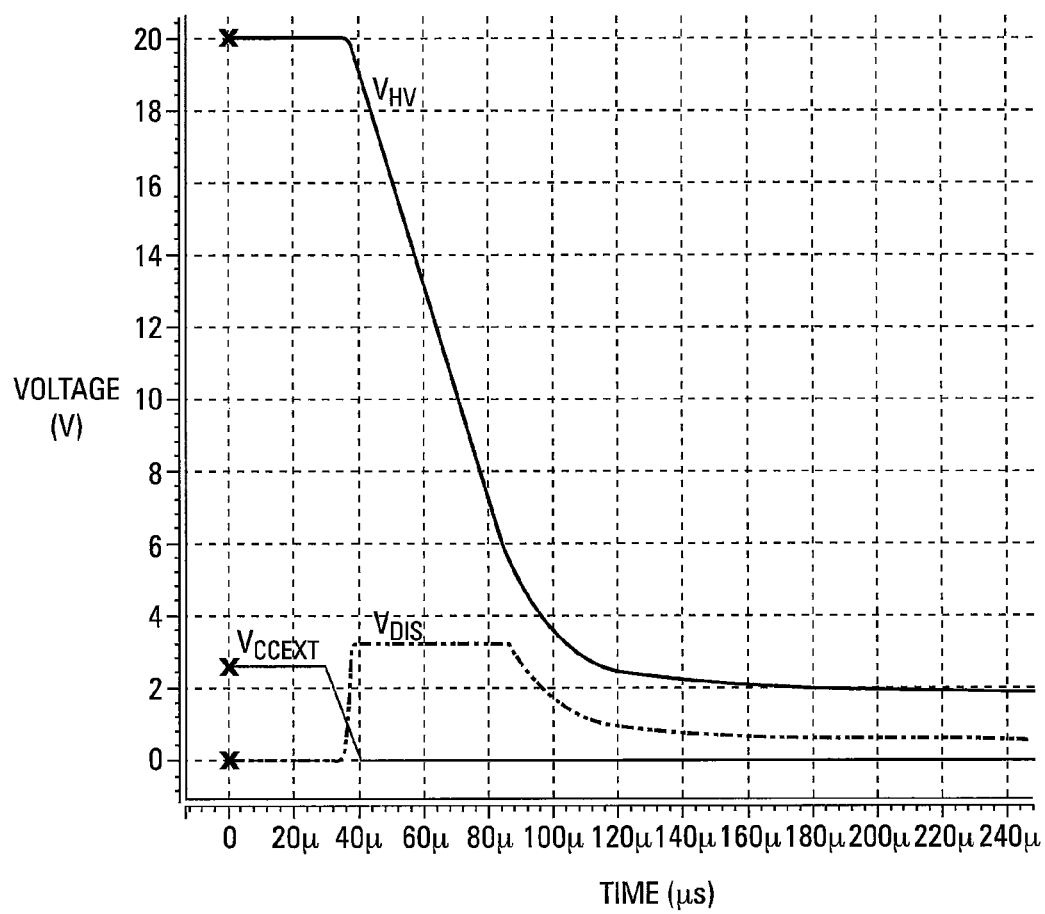
FIG. 4 shows a plot of one embodiment of voltage versus time in accordance with the embodiment of FIG. 3.

FIG. 4 illustrates one embodiment of voltage waveforms in accordance with the embodiment of FIG. 3. FIG. 4 shows voltages along the y-axis and time along the x-axis. The time and voltages are for purposes of illustration of the operation of the embodiment of FIG. 3. Alternate embodiments can use other time and voltage values.

FIG. 4 shows that when $V_{CCEXT}$ goes from approximately 2.5V to 0V between 28 μs and 40 μs, the $V_{DIS}$ node goes from 0V to approximately 3V. At this point, the 20V $V_{HV}$ is discharged to 2V.

Figure 5:
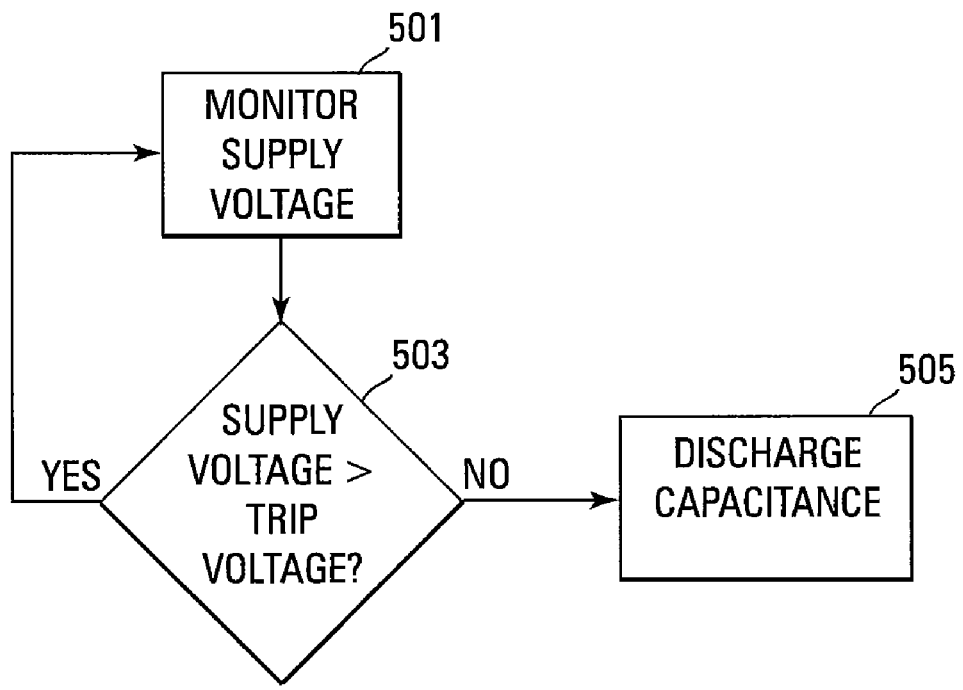
FIG. 5 shows a flowchart of one embodiment of a method for discharge in accordance with the embodiment of FIG. 3.

FIG. 5 illustrates a flowchart of one embodiment of a method for discharging relatively high voltage nodes of a memory device. The supply voltage $V_{CCEXT}$ is monitored 501. When the supply voltage decreases below a particular trip voltage 503 while the circuit input has a relatively high voltage (e.g., 15-30V), the high voltage node discharge circuit turns on and discharges the capacitance 505 to circuit ground from the relatively high voltage down to a safe voltage (e.g., 2V).

Figure 6:
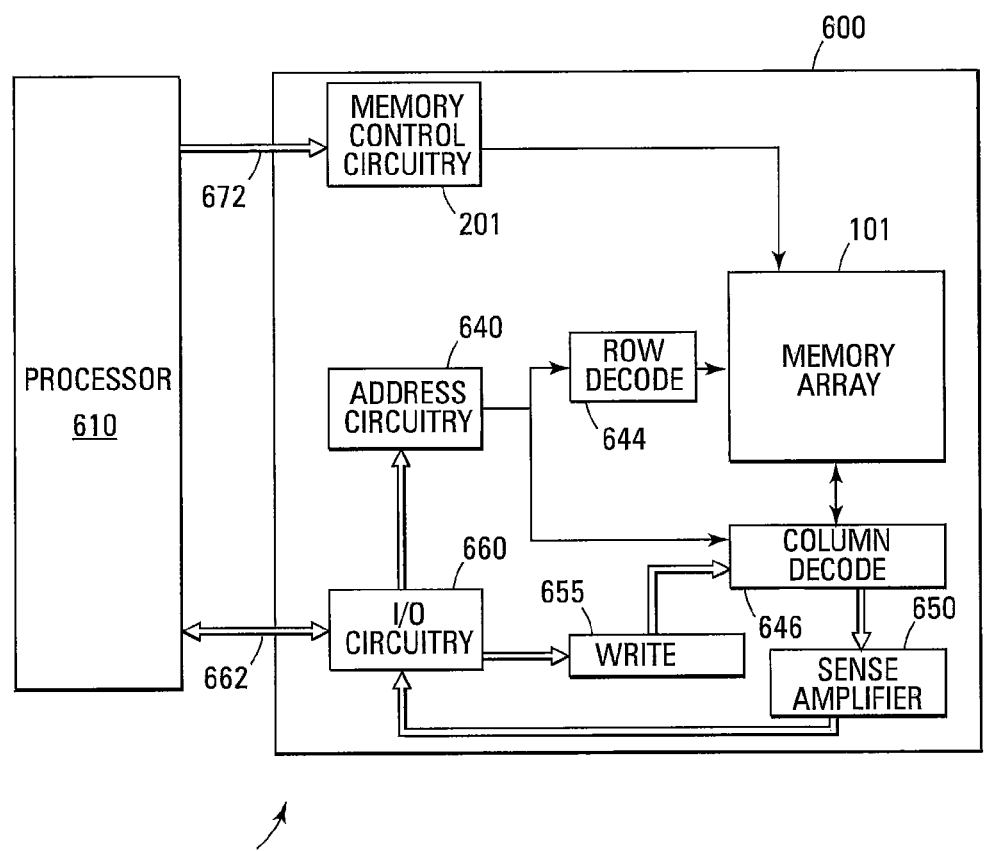
FIG. 6 shows a block diagram of one embodiment of a memory system that can incorporate the discharge circuit embodiment of FIG. 3.

FIG. 6 illustrates a functional block diagram of a memory device 600. The memory device 600 is coupled to an external processor 610. The processor 610 may be a microprocessor or some other type of controller. The memory device 600 and the processor 610 form part of a memory system 620.

The memory device 600 includes an array 101 of memory cells (e.g., non-volatile memory cells). The memory array 101 is arranged in banks of word line rows and bit line columns. In one embodiment, the columns of the memory array 101 comprise series strings of memory cells.

Address buffer circuitry 640 is provided to latch address signals provided through I/O circuitry 660. Address signals are received and decoded by a row decoder 644 and a column decoder 646 to access the memory array 101.

The memory device 600 reads data in the memory array 101 by sensing voltage or current changes in the memory array columns using sense amplifier circuitry 650. The sense amplifier circuitry 650, in one embodiment, is coupled to read and latch a row of data from the memory array 101. Data input and output buffer circuitry 660 is included for bidirectional data communication as well as the address communication over a plurality of data connections 662 with the controller 610. Write circuitry 655 is provided to write data to the memory array.

Memory control circuitry 201 decodes signals provided on control connections 672 from the processor 610. These signals are used to control the operations on the memory array 101, including data read, data write (program), and erase operations. The memory control circuitry 201 may be a state machine, a sequencer, or some other type of controller to generate the memory control signals. In one embodiment, the memory control circuitry 201 is configured to control sensing, programming, and erasing of memory cells.

The memory device illustrated in FIG. 6 has been simplified to facilitate a basic understanding of the features of the memory. A more detailed understanding of internal circuitry and functions of flash memories are known to those skilled in the art.

CONCLUSION

In summary, one or more embodiments discharge capacitance in memory circuits and memory array bulk from a relatively high voltage down to a safe voltage, such as one that does not affect memory operation. A discharge circuit senses the loss of the supply voltage and, at a particular trip voltage, turns on the discharge circuit.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention.

What is claimed is:

1. A memory device comprising:
    a memory array comprising a plurality of memory cells;
    memory support circuitry coupled to the memory array; and
    a discharge circuit coupled to the memory support circuitry wherein, in response to a particular decrease in a supply voltage below a particular voltage, the discharge circuit is configured to discharge a capacitance of the memory support circuitry from a first voltage to a second voltage wherein the particular voltage is determined by an architecture of the discharge circuit.

2. The memory device of claim 1 wherein the memory array is formed in an array bulk and at least one discharge circuit is coupled to the array bulk, wherein the at least one discharge circuit discharges a capacitance of the array bulk in response to the decrease in the supply voltage.

3. The memory device of claim 2 wherein the at least one discharge circuit coupled to the array bulk comprises a plurality of discharge circuits.

4. The memory device of claim 1 wherein the first voltage is a voltage in a range of 15V to 30V.

5. The memory device of claim 1 wherein the memory support circuitry comprises word line switches configured to switch voltages to particular word lines of the memory array.

6. The memory device of claim 1 wherein the memory array is formed in an array bulk and the memory support circuitry comprises array bulk switches configured to switch voltages to the array bulk.

7. A memory device comprising:
an array of memory cells formed in at least a portion of an array bulk;
a voltage generator configured to generate a voltage;
a switch circuit configured to couple the voltage generator to the array bulk and configured to switch a particular voltage from the voltage generator to the at least a portion of the array bulk; and
a discharge circuit coupled to the array bulk, the discharge circuit configured to discharge a voltage from a capacitance coupled to the at least one portion of the array bulk in response to a supply voltage decreasing below a trip voltage wherein the trip voltage is determined by an architecture of the discharge circuit.

8. The memory device of claim 7 wherein the array of memory cells is formed in a well in the array bulk.

9. The memory device of claim 7 wherein the array of memory cells comprises a plurality of non-volatile memory cells.

10. The memory device of claim 7 wherein the memory array comprises a NAND architecture.

11. The memory device of claim 7 wherein the array bulk comprises one of silicon or germanium.

12. A memory system comprising:
an array of memory cells formed in an array bulk;
memory control circuitry configured to generate memory control signals;
a plurality of voltage generators coupled to the memory control circuitry and configured to generate a plurality of different voltages in response to the memory control signals;
a first set of switches coupled to the array of memory cells, the memory control circuitry, and the plurality of voltage generators, the first set of switches configured to switch the plurality of different voltages to the array of memory cells in response to the memory control signals;
a second set of switches coupled to the array bulk, the memory control circuitry, and the plurality of voltage generators, the second set of switches configured to switch the plurality of different voltage to the array bulk in response to the memory control signals; and
a plurality of discharge circuits coupled to the array bulk and the first set of switches, each of the plurality of discharge circuits configured to discharge a voltage from a capacitance in response to a supply voltage coupled to each discharge circuit going below a trip voltage.

13. The memory system of claim 12 wherein each discharge circuit comprises:
first and second high voltage transistors coupled to a circuit input;
first and second depletion mode transistors, each depletion mode transistor respectively coupled in series with the first and second high voltage input transistors;
a discharge transistor coupled in series with the second depletion mode transistor;
first and second supply voltage transistors coupled in series with the first depletion mode transistor, each supply voltage transistor having a gate coupled to a supply voltage and a node between the first and second supply voltage transistors coupled to a gate of the discharge transistor; and
a transistor having a drain and gate coupled to the supply voltage and a source coupled to a node between the first depletion mode transistor and the first supply voltage transistor.

14. The memory system of claim 13 wherein the first and second high voltage transistors comprise thick oxide NMOS transistors, the first and second depletion mode transistors comprise depleted NMOS, and the discharge transistor comprises an NMOS transistor.

15. The memory system of claim 13 wherein the circuit input is coupled to the capacitance to be discharged.

16. A discharge circuit comprising:
a first circuit branch comprising:
a first transistor having a gate connection and a drain connection coupled to a circuit input;
a second transistor having a drain connection coupled to a source connection of the first transistor and a gate connection coupled to circuit ground;
a third transistor having a gate connection coupled to a circuit supply voltage, and a source connection coupled to a source connection of the second transistor;
a fourth transistor having a gate connection coupled to the circuit supply voltage, a drain connection coupled to a drain connection of the third transistor, and a source connection coupled to the circuit ground; and
a fifth transistor having a gate connection coupled to a drain connection and the circuit supply voltage, the fifth transistor further having a source connection coupled to a body connection of the third transistor and a node between the second and third transistors; and
a second circuit branch comprising:
a first transistor having a gate connection and a drain connection coupled to the circuit input;
a second transistor having a drain connection coupled to a source connection of the first transistor and a gate connection coupled to the circuit ground; and
a third transistor having a drain connection coupled to a source connection of the second transistor, a source connection coupled to the circuit ground, and a gate connection coupled to a node between the third and fourth transistors of the first circuit branch.

17. The discharge circuit of claim 16 wherein fabrication of the third and fourth transistors of the first circuit branch determine a trip voltage at which the circuit discharges a voltage from a capacitance coupled to the circuit input.

18. The discharge circuit of claim 17 wherein the third transistor of the second circuit branch discharges to the circuit ground the voltage from the capacitance when the circuit supply voltage becomes less than the trip voltage while a voltage on the circuit input is greater than a particular voltage.

19. The discharge circuit of claim 18 wherein a voltage drop across the fifth transistor of the first circuit branch causes the third transistor to discharge to circuit ground when the voltage drop is less than or equal to the trip voltage.

20. A memory device comprising:
an array of memory cells formed in at least a portion of an array bulk;
a voltage generator configured to generate a voltage;
a switch circuit configured to couple the voltage generator to the array bulk and configured to switch a particular voltage from the voltage generator to the at least a portion of the array bulk;
a discharge circuit coupled to the array bulk, the discharge circuit configured to discharge a voltage from a capacitance coupled to the at least one portion of the array bulk in response to a supply voltage decreasing below a trip voltage;

a plurality of word line switches configured to couple the voltage generator to the array of memory cells;

a capacitance coupled to each word line switch; and a discharge circuit coupled to each capacitance.

21. The memory device of claim 20 wherein the capacitance coupled to each word line switch is a capacitor.

22. The memory device of claim 20 wherein the capacitance comprises a parasitic capacitance.

* * * * *